United States Patent
Yang et al.

(10) Patent No.: US 6,839,284 B1
(45) Date of Patent: Jan. 4, 2005

(54) METHOD OF PROGRAMMING AND ERASING A NON-VOLATILE SEMICONDUCTOR MEMORY

(75) Inventors: Ching-Sung Yang, Changhua Hsien (TW); Hsiang-Chung Chang, Taichung (TW)

(73) Assignee: Powerchip Semiconductor Corp., Hsinchu (TW)

( * ) Notice: Subject to any disclaimer, the term of this patent is extended or adjusted under 35 U.S.C. 154(b) by 9 days.

(21) Appl. No.: 10/462,654

(22) Filed: Jun. 17, 2003

(51) Int. Cl.$^7$ .................................. G11C 16/00
(52) U.S. Cl. ..................... 365/185.29; 365/185.03; 365/185.18; 365/185.24; 365/185.3
(58) Field of Search .................. 365/185.29, 185.3, 365/185.03, 185.18, 185.24

(56) References Cited

U.S. PATENT DOCUMENTS

| | | | | |
|---|---|---|---|---|
| 4,797,856 A | * | 1/1989 | Lee et al. ................. | 365/185.3 |
| 5,220,533 A | * | 6/1993 | Turner ..................... | 365/185.3 |
| 5,576,993 A | * | 11/1996 | Hong .................... | 365/185.29 |
| 6,185,133 B1 | * | 2/2001 | Chan et al. ............ | 365/185.29 |
| 6,233,175 B1 | * | 5/2001 | Wang et al. ........... | 365/185.03 |
| 6,552,387 B1 | * | 4/2003 | Eitan ......................... | 257/324 |

* cited by examiner

Primary Examiner—Tan T. Nguyen
(74) Attorney, Agent, or Firm—Dennison, Schultz, Dougherty & MacDonald

(57) ABSTRACT

A method of programming and erasing a non-volatile semiconductor memory is provided. The memory device for such operation has one first conductivity substrate (10), a plurality of second conductivity deep ion wells (12), a plurality of shallow ion wells (14), a plurality of memory cell arrays disposed above the shallow ion wells (14), a plurality of bit lines (BL) connected to the shallow ion wells (14) through respective conductive plugs (18), and a plurality of shallow trench insulation (STI) layers (16) above the substrate (10). The programming of memory cells with multi-level data storage takes a threshold voltage (Vth) in the negative voltage range, whilst the erasing of memory cells takes a threshold voltage (Vth) in the positive voltage range. The erasing operation is performed in conjunction with a self-limiting means to prevent continuous ascending of the threshold voltage (Vth) as the erasing operation is in progress.

7 Claims, 7 Drawing Sheets

| | SGB | BL | BLx | WL | Vpass | WLx | SGS | sL |
|---|---|---|---|---|---|---|---|---|
| PROGRAM | 9V | 7V | 0V | −9V | 0V | 0V | 0V | FLOAT |
| ERASE | −6V | FLOAT | FLOAT | 9V | −6V | FLOAT | −6V | −6V |
| READ | 3.3V | 0V | 1V | 0V | 5V | 0V | 3.3V | 1V |

METHOD OF PROGRAMMING AND ERASING A NON-VOLATILE SEMICONDUCTOR MEMORY

BACKGROUND OF THE INVENTION

1. Field of the Invention

The present invention relates to a method of programming and erasing a non-volatile semiconductor memory, in particular to a method of operating the flash memory that is capable of supporting multi-level data storage with enhanced conductivity and without noise disturbance.

2. Description of Related Arts

Programming and erasing of a flash memory is usually performed by channel hot electron (CHE) or Fowler-Nordheim tunneling (FN tunneling). However, using CHE to write into memory cells usually requires excessively high power consumption. The industry has therefore developed a NAND flash memory that is operated with low power.

The structure of a memory cell (70) in a conventional NAND flash memory, as shown in FIG. 1, comprises:

a p-well (72);

an n-source (74) formed on top of the p-well (72);

an n-drain (76) formed on top of the p-well (72) corresponding to the position of the n-source (74);

a stacked gate (80), formed on the surface of the p-well (72), disposed in between the n-drain (76) and the n-source (74); wherein The stacked gate (80) is built with a control gate (78), three successive insulation layers (82, 84, 86) of silicon oxide, silicon nitride and silicon oxide respectively, and a floating gate (88).

The above-mentioned memory cell (70) of the NAND flash memory still has several shortcomings:

FIG. 2 shows a cross-section of the memory cells (70) of a NAND memory built in the form of a memory array, and FIG. 3 shows an equivalent circuit for the memory array (700). In the NAND flash memory, all memory cells (70) are formed on top of the same p-well (72) which is formed by an n-source (74) or an n-drain (76), and the diffusion region over the p-well is connected to a bit line (BL).

When programming a NAND memory cell, a bit line voltage ($V_{BL}$) is applied over the bit line (BL), and a word line voltage ($V_{WL}$) is simultaneously applied on a predetermined word line(WL) in order to induce FN tunneling for writing into a predetermined memory cell (70a). Since the selected memory cells (70a) and the non-selected memory cells (70b) are all located above a common p-well (72), the voltage applied on selected memory cells (70a) will affect other memory cells (70b) down the line sharing the same word line (WL) as a result of the FN tunnel effect. The original status of the non-selected memory cell (70b) therefore will be seriously affected. Thus, the selectivity and the efficiency of such programming/erasing operations are in question.

With reference to FIG. 4, a method of randomly programming non-volatile semiconductor memory has been proposed to solve the above-mentioned problem. One implementation of the scheme (as shown in FIG. 4) is explained hereinafter. The structure of the memory device includes:

a p-substrate (32);

a plurality of deep n-wells (34) disposed on top of the p-substrate (32);

a plurality of shallow p-wells (36) disposed in the above deep n-wells (34);

a plurality of memory cell arrays (M) created above the shallow p-wells (36);

a plurality of shallow trench insulation (STI) layers (38) disposed over the p-substrate (32) and in between the respective shallow p-wells (36), for isolating memory cell arrays (M); and a plurality of bit lines (BL) disposed on the p-substrate (32) and extending downward to the shallow p-well (36) through a conductive plug (40).

In the architecture of the above-mentioned memory device, the shallow p-well (36) forms a common electrode of the memory cell arrays (M). Since a shallow p-well (36) is connected to a bit line (BL) through a conductive plug (40), this design is equivalent to a buried bit line. When programming the flash memory cells, a 5V positive voltage pulse is applied on a predetermined bit line (BL), and a 10V negative voltage is simultaneously applied on the word line of the selected memory cell to create the FN tunnel effect. Since adjacent memory cell arrays (M) are isolated by the STI layer (38) in other shallow p-wells, those memory cells having the same word line (WL) as the selected memory cell will not be affected by the FN tunnel effect, thus overcoming the previously encountered problem when programming a NAND flash memory.

A new operation mode has been proposed along with the above-mentioned NAND flash memory. As shown in FIG. 5, a negative voltage is applied on the word line (WL) of a selected memory cell in the programming operation (PGM), and a positive voltage is applied on the word line (WL) of a selected memory cell in the erasing operation (ERS), in contrast to the conventional method of PGM and ERS, as shown in FIG. 6, in which a positive voltage pulse is used for PGM, whilst a negative voltage pulse is for ERS. It is noted that this operation mode can support multi-level storage on the above-mentioned flash memory.

FIG. 7 shows the distribution of a threshold voltage (Vth) for conventional flash memory cells, in which the erasing operation (ERS) is done using the negative voltage range, and the programming with multi-level storage using the positive voltage range. If the positive voltage range is provided with 1–3V for the multi-level data storage, this means there will be only a narrow pulse width allowance for each type of data stored in the same cell. It is necessary to increase the voltage range for multi-level data storage, for example using 1–5V instead of 1–3V. However, with the increased threshold voltage (Vth), the pass gate voltage (Vpass) is also increased proportionally to maintain the proper potential for the FN tunneling. However, the increased pass gate voltage (Vpass) entails more power consumption, which is obviously counter to the present design trend of low-power memory devices. The disclosure of the above-mentioned pattern application can solve the apparent dilemma.

However, since the threshold voltage (Vth) is rising gradually in relation to the erasing time, the pulse width of the threshold voltage (Vth) should be suitably restrained for the use of positive voltages in erasing, in order to avoid the concomitant increase of pass gate voltage (Vpass) along with the threshold voltage (Vth).

SUMMARY OF THE INVENTION

The main object of the present invention is to provide a method of operating a flash memory with multi-level data storage to enhance conductivity and prevent noise disturbance.

To this end, the threshold voltages (Vth) for such memory operations on the flash memory are defined, such that the threshold voltage (Vth) for erasing (ERS) occurs in the positive voltage range, whilst the programming (PGM) with multi-level data storage occurs in the negative voltage range. Since the threshold voltages (Vth) for multi-level data storage are defined in the negative voltage range, the voltage difference between the floating gate and the shallow p-well can be suitably increased to create a larger gate drive for higher pass gate voltage (Vpass) having enhanced conductivity and without noise disturbance.

When performing an erasing operation (ERS) in the positive voltage range, a self-limiting means is started along with the erasing operation to prevent the continuous ascending of threshold voltage as the erasing is in progress (i.e. the increase in cumulative time). It is known that a continuous ascending threshold voltage (Vth) will adversely affect the efficiency of the erasing operation (ERS) in progress.

The architecture of the above-mentioned flash memory comprises:

one first conductivity substrate;
a plurality of second conductivity deep ion wells being disposed on top the first conductivity substrate;
a plurality of shallow ion wells being disposed in the respective second conductivity deep ion wells;
a plurality of memory cell arrays over the first conductivity shallow ion wells;
a plurality of shallow trench insulation (STI) layers being disposed over the first conductivity substrate and in between several shallow ion wells for mutual isolation of memory cell arrays;
a plurality of bit lines being disposed on the first conductivity substrate and extending downward to the shallow ion wells through respective conductive plugs; wherein
each memory cell array is formed by a plurality of memory cells, of which one end is connected to a selection transistor;
each memory cell includes a diffused drain and a diffused source over the first conductivity shallow ion well, a floating gate on the surface of the first conductivity shallow ion well and in between the diffused drain and source, and a control gate disposed on the top portion of floating gate and connected by a word line.

Under the above memory architecture, a negative voltage is applied to a word line in programming a memory cell, and a positive voltage is simultaneously applied to the related bit line. The bit line is connected to the shallow ion well through the conductive plug forming a common electrode to induce the Fowler-Nordheim tunneling between the floating gate of the selected memory cell and the shallow ion well, and to force electron ejection from the floating gate into the shallow ion well, thus accomplishing the selective programming operation (PGM).

In the erasing operation (ERS), a positive voltage is applied on a word line, and at the same time a negative voltage is applied on a source line connected by a selection transistor to force the bit line to enter a floating state in order to induce FN tunneling forcing ejection of electrons from the shallow ion well into the floating gate thus accomplishing the selective erasing operation (ERS).

The self-limiting means is started along with the erasing operation (ERS) after a positive pulse and a negative pulse are applied respectively on a word line and a source line. The positive pulse and the negative pulse applied respectively on a bit line and a word line force a discharge of minority electrons from the floating gate in order to suppress the rising threshold voltage (Vth) as the erasing is in progress (i.e. the increase in cumulative time).

The voltage convergence speed of the above-mentioned self-limiting means will vary in accordance with the voltage level used in discharge and the pulse width.

The features and structure of the present invention will be more clearly understood when taken in conjunction with the accompanying drawings.

DETAILED DESCRIPTION OF THE PREFERRED EMBODIMENT

Figure 1:
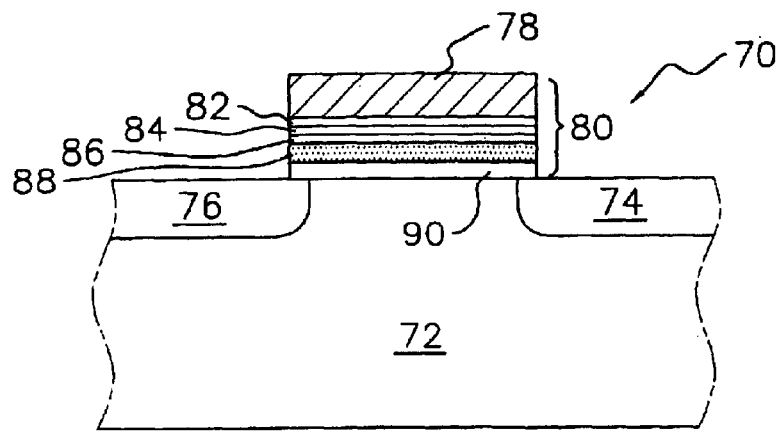
FIG. 1 is a diagram of the structure of a memory cell in the conventional flash memory.
Figure 2:
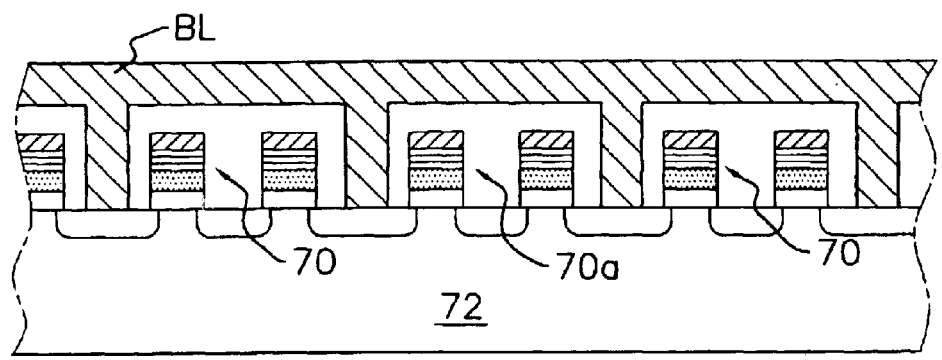
FIG. 2 is a cross-sectional view of the memory array in a conventional NAND memory.
Figure 3:
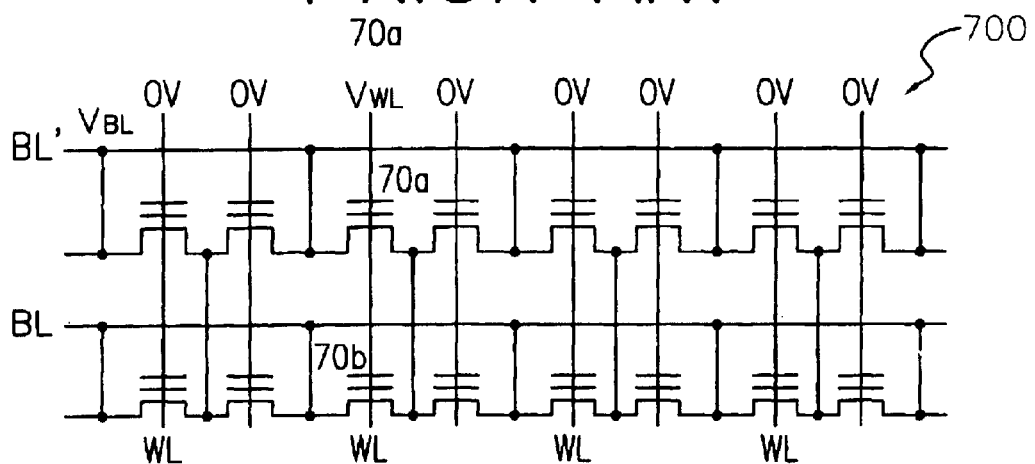
FIG. 3 is an equivalent circuit diagram of a memory array in conventional NAND flash memory.
Figure 4:
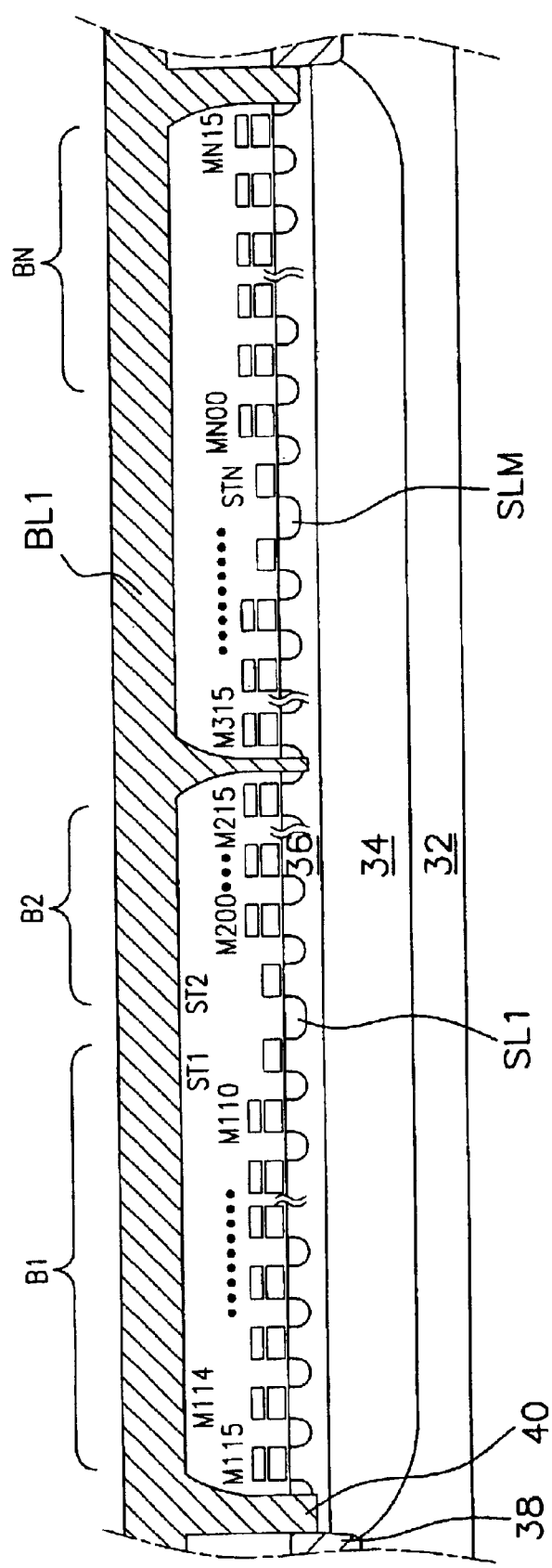
FIG. 4 is a schematic view of a conventional memory structure.
Figure 5:
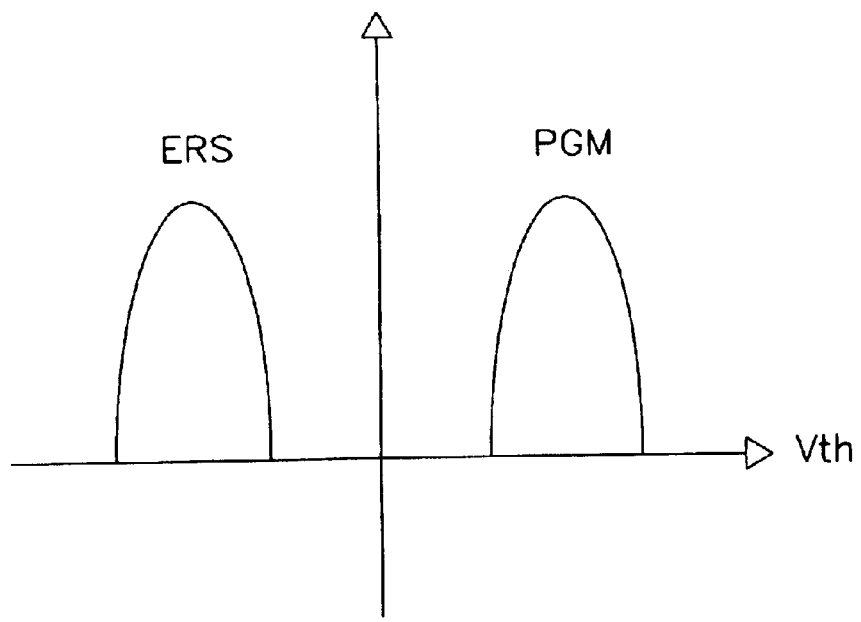
FIG. 5 is a distribution of the threshold voltage of memory cells of FIG. 4.
Figure 6:
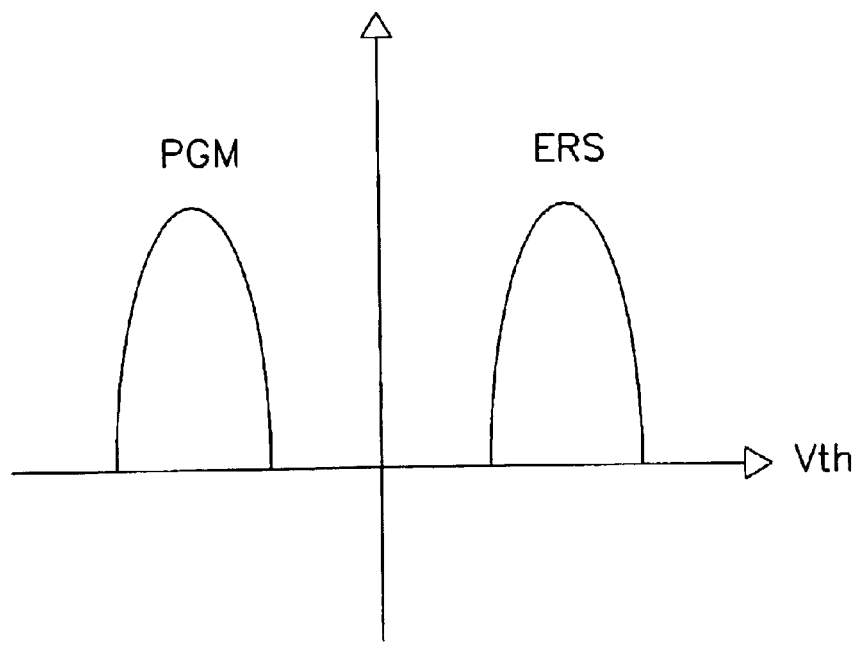
FIG. 6 is a distribution of the threshold voltage (Vth) for operating conventional memory cells.
Figure 7:
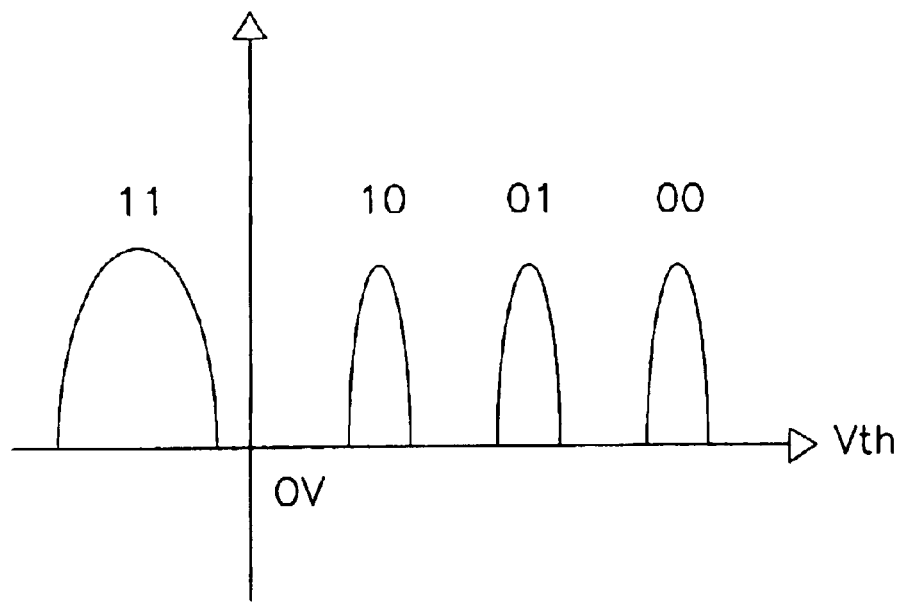
FIG. 7 is a distribution of the threshold voltage (Vth) for operating conventional memory cells with multi-level storage.
Figure 8:
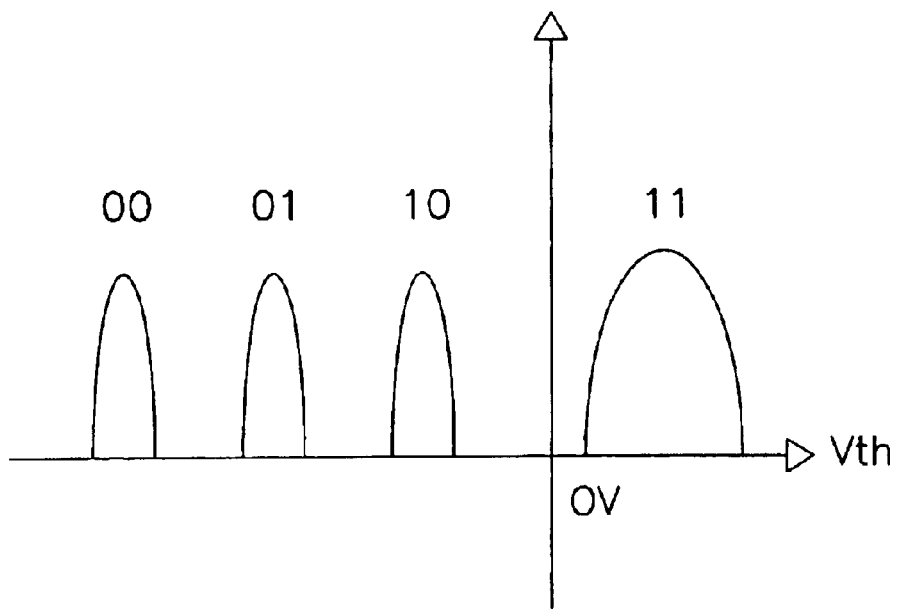
FIG. 8 is a distribution of the threshold voltage (Vth) for the present invention with multi-level storage.

The present invention provides a method of programming flash memory with multi-level storage in the negative voltage range and erasing flash memory in the positive voltage range, as shown in FIG. 8, with enhanced conductivity and without noise disturbance.

In addition, a self-limiting means is performed along with the erasing operation (ERS) to prevent the continuous ascending of threshold voltage (Vth) as the erasing is in progress.

Figure 9:
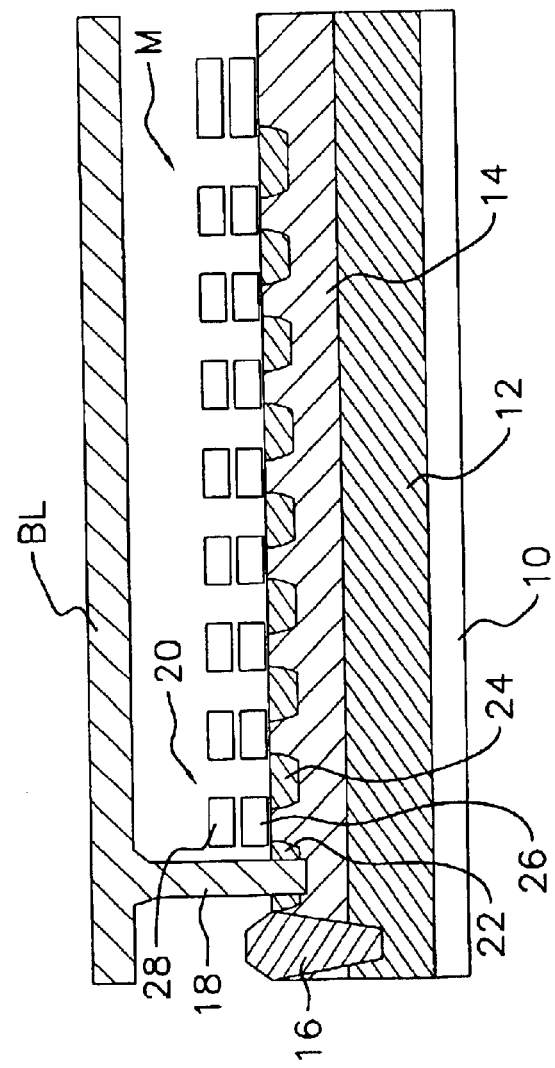
FIG. 9 is a cross-sectional view of the structure of memory cell array in accordance with the present invention.
Figure 10:
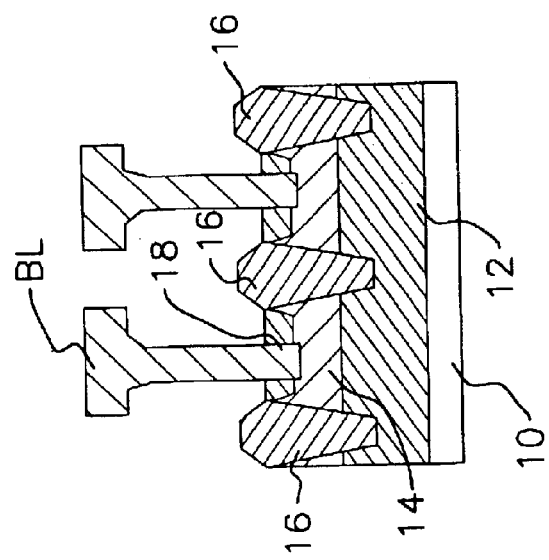
FIG. 10 is a cross-sectional view of the structure of memory cell array for another embodiment of the invention.

To this end, the memory cell structure in accordance with the present invention as shown in FIG. 9 comprises:

a first conductivity substrate (10);
a plurality of a second conductivity deep ion wells (12), being disposed on top of the first conductivity substrate (10);
a plurality of a first conductivity shallow ion wells (14) being disposed in the second conductivity deep ion wells (12);
a plurality of memory cell arrays (M) being formed over the first conductivity shallow ion wells (14);
a plurality of shallow trench insulation (STI) layers (16) being disposed over the first conductivity substrate (10)

and in between the shallow ion wells (14) for mutual isolation of different memory cell arrays (M) (as shown in FIG. 10);

a plurality of bit lines (BL) being disposed on the first conductivity substrate (10) and extended to shallow ion wells (14) through respective conductive plugs (18), where, in the current embodiment, the first conductivity material is a P-type, and the second conductivity material is an N-type.

Figures 11, 12:
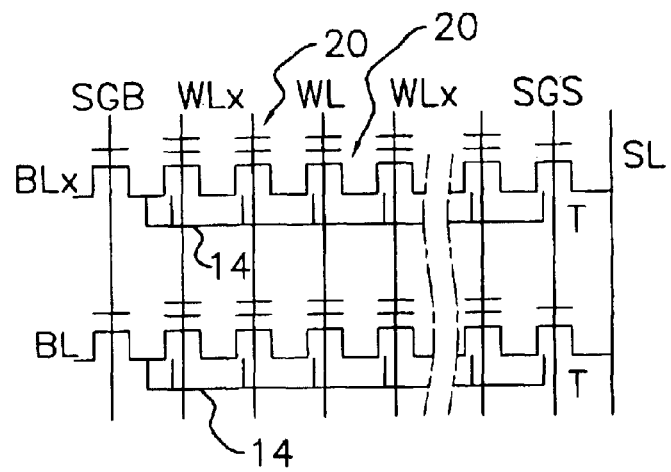
FIG. 11 is an equivalent circuit diagram of the memory cell array of the present invention.
FIG. 12 is a table showing the operating voltages for the present invention.

Each memory cell (20) has a drain (22) and a source (24) corresponding to the position of the diffusion region on the shallow ion wells (14), a floating gate (26) created on the surface of the shallow ion wells (14) and in between the drain (22) and the source (24), and a control gate (28) created above the floating gate (26), wherein the floating gate (26) can be formed with an ONO structure, and the control gate (28) is connected to the corresponding word line (WL), as shown in FIG. 11.

FIG. 11 shows the equivalent circuit diagram of the above-mentioned memory cell, where a plurality of memory cells are interconnected to form a memory cell array (M), and one end of the memory cell array (M) is connected by a selection transistor (T).

With this type of memory cell array (M), a threshold voltage (Vth) for an erasing operation (ERS) is defined in the positive voltage range, and a threshold voltage for programming (PGM) with multi-level storage is defined in the negative voltage range.

After laying out the architecture of the memory cell, the detailed procedures for the above operations are to be explained.

In the programming mode (PGM), a negative voltage is applied on a selected word line (WL), and a positive voltage is simultaneously applied on a selected bit line (BL). The bit line (BL) is connected to the shallow ion wells (14) through the conductive plug (18) to form a common electrode. Under a given voltage difference between the floating gate (26) and the shallow p-well (14), the Fowler-Nordheim tunneling is induced in between the shallow ion well (14) and the floating gate (26) over the selected word line (WL), forcing the ejection of electrons from the floating gate (26) into the shallow ion wells (14) to cause the given threshold voltage (Vth) to appear on the selected memory cell for selective programming (PGM). The operating conditions are shown in table 11.

Since the multi-level storage is operated on the negative voltage range, the increase in voltage difference between the floating gate (26) and the shallow p-well (14) creates a larger gate drive for pass gate voltage (Vpass) having enhanced conductivity.

In the erasing mode (ERS), a positive voltage is applied over a selected word line (WL), and a negative voltage is simultaneously applied on the source line (SL) of the selection transistor (T) to force the bit line to enter a state of float to induce Fowler-Nordheim tunneling. The FN tunnel effect will force the ejection of electrons from the shallow ion wells (14) into the floating gate (26) to accomplish selective erasing (ERS).

The above-mentioned erasing operation (ERS) is performed in the positive voltage range with a fixed voltage level. There is therefore no need to increase the voltage difference between the floating gate (26) and the shallow p-wells (14) as in the case of the programming operation (PGM) for supporting multi-level storage, thus obviating the problem of concomitant increase of threshold voltage (Vth) and pass gate voltage (Vpass). Since the threshold voltage (Vth) in the erasing operation (ERS) is directly related to the erasing time, as demonstrated in FIG. 13, the longer it takes for the erasing operation; the higher will be the threshold voltage (Vth). To suppress this trend of ascending voltage value, in accordance with the present invention, a self-limiting means is simultaneously started when the erasing operation (ERS) is performed, by which a discharge of electrons is allowed for an appropriate length of time after the Fowler-Nordheim tunneling to confine the threshold voltage (Vth) within a predetermined value range to prevent the continuous ascending of the threshold voltage as the erasing is in progress (i.e. the increase in cumulative time).

Figure 14:
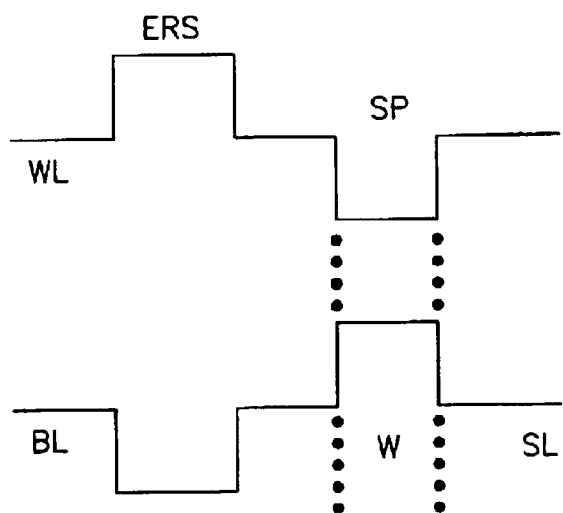
FIG. 14 is a waveform of the discharge pulse in accordance with the present invention.

The method of self-limiting means is illustrated in FIG. 14. A positive voltage pulse is first applied over a selected word line (WL), and a pulse of negative voltage is simultaneously applied over a selected source line (SL) to induce the Fowler-Nordheim tunneling for the erasing operation (ERS). Thereafter, to induce the discharge of minority electrons, a stopper pulse (SP) of negative voltage is applied on the word line (WL), and a positive voltage pulse is simultaneously applied on the bit line (BL), forcing the source line (SL) to enter a state of floating to induce the ejection of minority electrons from the floating gate (26) into the shallow ion wells (14). This release of minority electrons from the floating gate (26) will force the threshold voltage (Vth) to decrease, thus suppressing the continuous ascending of the threshold voltage as the erasing is in progress (i.e. the increase in cumulative time).

Figure 13:
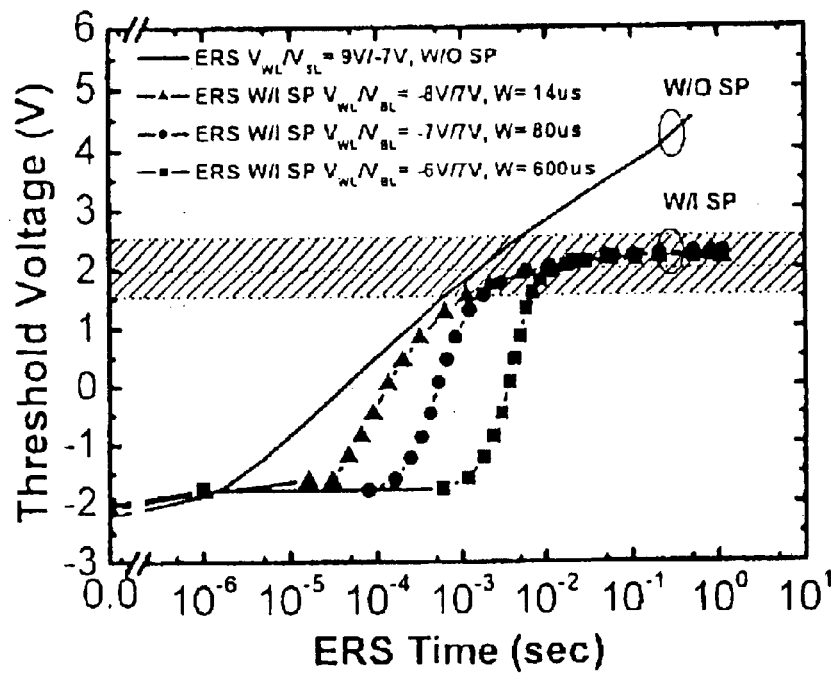
FIG. 13 is a chart showing the self-limiting means to control threshold voltage (Vth) in accordance with the present invention.

The above-mentioned self-limiting means will yield different voltage convergence speeds due to the different potentials for the stopper pulse (SP) and the pulse widths. In FIG. 13 the results of the self-limiting means yield the same threshold voltages (Vth) under the various conditions, where the curve denoted by ▲ represents the first stopper pulse of discharge (SP) with the potential on the word line(WL) set at −8V, the potential on the bit line (BL) at 7V, and the pulse width of 14 $\mu$sec; the curve denoted by ● represents the second stopper pulse of discharge (SP) with the potential on the word line(WL) set at −7V, the potential on the bit line(BL) at 7V, and the pulse width of 80 $\mu$sec, the curve denoted by ■ represents the third stopper pulse of discharge (SP) with the potential on the word line (WL) set at −6V, the potential on the bit line (BL) at 7V, and the pulse width of 600 $\mu$sec.

The above-mentioned stopper pulses with different discharge times and intensity of the discharge pulse therefore result in the same threshold voltage with different voltage convergence speeds.

In summary, the present invention chooses to use the positive voltage range for erasing (ERS) and the negative voltage range for programming (PGM) with multi-level storage. During the programming (PGM) of memory cells, the voltage difference between the floating gate (26) and the shallow p-wells (14) has to be suitably increased to support the multi-level data storage, such that the negative value of a threshold voltage (Vth) will be increased for heightening pass gate voltage (Vpass) to enhance conductivity. The self-limiting means in conjunction with the erasing operation (ERS) is necessary to confine the threshold voltage (Vth) in a predetermined range to prevent the continuous ascending of the threshold voltage as the erasing is in progress (i.e. the increase in cumulative time).

The foregoing description of the preferred embodiments of the present invention is intended to be illustrative only and, under no circumstances, should the scope of the present invention be so restricted.

What is claimed is:

1. A method of programming and erasing non-volatile semiconductor memory, comprising:

defining threshold voltages (Vth) for erasing memory cells in the positive voltage range;

defining threshold voltages (Vth) for programming memory cells with multi-level data storage in the negative voltage range; wherein the erasing operation is performed in conjunction with a self-limiting means to force the threshold voltage (Vth) for erasing flash memory to occur in the positive voltage range, and the programming with multi-level storage in the negative voltage range; wherein the erasing operation in the positive voltage range is performed in conjunction with a self-limiting means to confine the threshold voltage within a predetermined level to avoid the continuous ascending of the threshold voltage as the erasing is in progress (i.e. the increase in cumulative time).

2. The method as claimed in claim 1, wherein the memory cell comprising:

a first conductivity substrate (10);

at least one second conductivity deep ion well (12) being formed on top of the first conductivity substrate (10);

at least one first conductivity shallow ion well (14), being formed in the second conductivity deep ion well (12); wherein (as in the current embodiment) the first conductivity material is a P-type, and the second conductivity material is an N-type;

at least one memory cell array, being formed over the first conductivity shallow ion well (14);

a plurality of shallow trench insulation (STI) layers (16) being formed over the first conductivity substrate (10) and in between the shallow ion well (14) for mutual isolation of memory cell arrays;

a plurality of bit lines (BL) being disposed on the first conductivity substrate (10), and extending downward to the shallow ion well (14) through respective conductive plugs (18); wherein each memory cell array is formed by a plurality of memory cells, and one end of the memory cell array is connected to a selection transistor; and each memory cell has a diffused drain (22) and a diffused source (24) corresponding to the diffusion region on the first conductivity shallow ion well (14), a floating gate (26) created on the surface of the shallow ion well (14) and in between the drain (22) and the source (24), and a control gate (28) created above the floating gate (26), such that the floating gate (26) is connected to the corresponding word line (WL).

3. The method as claimed in claim 2, wherein the erasing operation is carried out by applying a positive voltage on a selected word line (WL), and a negative voltage on the source line (SL) connected by the selection transistor forcing the bit line to enter a state of floating to induce the Fowler-Nordheim tunneling, so that electrons on the shallow ion wells (14) are injected into the floating gate (26) to accomplish the selective erasing.

4. The method as claimed in claim 3, wherein the self-limiting means for the erasing operation is performed by applying a negative voltage pulse on a selected word line (WL) following a positive voltage pulse being applied thereon, and further applying a positive voltage pulse on the bit line (BL) following a negative voltage pulse being applied on a source line (SL), such that the source line (SL) enters a state of floating to induce discharge of minority electrons from the floating gate (26).

5. The method as claimed in claim 3, wherein the voltage convergence speed of the self-limiting means varies in accordance with the voltage difference set for electron discharge and the pulse width.

6. The method as claimed in claim 2, wherein the first conductivity material is of a p-type and the second conductivity material is of an n-type.

7. The method as claimed in claim 2, wherein the floating gate (26) is formed with an ONO structure.

* * * * *